United States Patent
Fath et al.

(10) Patent No.: US 6,734,037 B1
(45) Date of Patent: May 11, 2004

(54) METHOD AND DEVICE FOR PRODUCING SOLAR CELLS

(75) Inventors: Peter Fath, Meersburg (DE); Markus Spiegel, Constance (DE); Thomas Pernau, Bad Durrheim (DE); Gernot Wandel, Blaubeuren (DE); Rainer Moller, Dresden (DE); Johann-George Reichart, Blaubeuren (DE)

(73) Assignees: Universität Konstanz, Constance (DE); Centrotherm Elektrische Anlagen GmbH & Co., Blaubeuren (DE)

( * ) Notice: Subject to any disclaimer, the term of this patent is extended or adjusted under 35 U.S.C. 154(b) by 0 days.

(21) Appl. No.: 10/110,487
(22) PCT Filed: Sep. 12, 2000
(86) PCT No.: PCT/DE00/03165
§ 371 (c)(1), (2), (4) Date: Sep. 26, 2002
(87) PCT Pub. No.: WO01/28005
PCT Pub. Date: Apr. 19, 2001

(30) Foreign Application Priority Data

Oct. 13, 1999 (DE) ......................................... 199 49 279
Dec. 23, 1999 (DE) ......................................... 199 62 896

(51) Int. Cl.$^7$ ............................................. H01L 21/00
(52) U.S. Cl. ........................... 438/57; 438/61; 438/162; 438/958; 118/715; 118/723 MN
(58) Field of Search .............................. 438/57, 61, 63, 438/151, 162, 958; 118/715, 723 R, 723 VE, 723 MW

(56) References Cited

U.S. PATENT DOCUMENTS

| 5,011,759 A | 4/1991 | Hitotsuyanagi et al. ...... 430/128 |
| 5,221,643 A | 6/1993 | Griep ........................ 437/233 |
| 5,470,763 A * | 11/1995 | Hamada ...................... 438/162 |
| 5,571,749 A | 11/1996 | Matsuda et al. ............. 437/113 |

FOREIGN PATENT DOCUMENTS

| DE | 36 10 401 | 2/1987 |
| DE | 39 05 297 | 8/1990 |
| WO | WO 96/08043 | 3/1996 |

OTHER PUBLICATIONS

Spiegel et al., "Ribbon Growth on Substrate (RGS) Silicon Solar Cells with Microwave–Induced Remote Hydrogen Plasma Passivation and Efficiencies Exceeding 11%", Solar Energy Materials & Solar Cells 55, 1998, pp. 331–340.*

*Low–Temperature Surface Passivation of Silicon Solar Cells By Means of a TMCTS Oxide*, E. Demesmaeker et al., Apr. 11–15, 1994, 12th European Photovoltaic Solar Energy Conference.

*Improvement in Multicrystalline Silicon Solar Cells After Thermal Treatment of PECVD Silicon Nitride Air Coating*, J. Szlufeik et al., Apr. 11–15, 1994, 12th European Photovoltaic Solar Energy Conference.

(List continued on next page.)

*Primary Examiner*—Kevin M. Picardat
(74) *Attorney, Agent, or Firm*—Baker & Daniels

(57) ABSTRACT

The present invention concerns a process for fabricating a solar cell, wherein material is deposited on a multicrystalline silicon substrate and passivation is performed by means of hydrogen plasma. It is proposed that the material be deposited by low-pressure CVD and the hydrogen passivation be effected by feeding in a hydrogen plasma induced remotely from the partially processed solar cells. A device for carrying out the process is also described.

26 Claims, 4 Drawing Sheets

OTHER PUBLICATIONS

*Progress In Low–Temperature Surface Pssivation of Silicon Solar Cells Using Remote–Plasma Silicon Nitride,* Armin G. Aberle et al., Sep. 10, 1996, Institute for Solar Energy Research.

*The Stability of $SiN_x$:$H$/$SiO2$ Double–Layer Passivation With Hydrogen–Radical Annealing,* H. Nagayoshi et al, 14th European Photovoltaic Solar Energy Conference, Jun. 30–Jul. 4, 1997.

*Optimal Surface and Bulk Passivation of High Efficiency Multicrystalline Silicon Solar Cells,* H.E. Elgamel et al., First WCPEC, Dec. 5–9, 1994.

*Detailed Study on Microwave Induced Remote Hydrogen Plasma Passivation of Multicrystalline Silicon,* M. Spiegel et al., 13th European Photovoltaic Solar Energy Conference, Oct. 23–27, 1995.

* cited by examiner

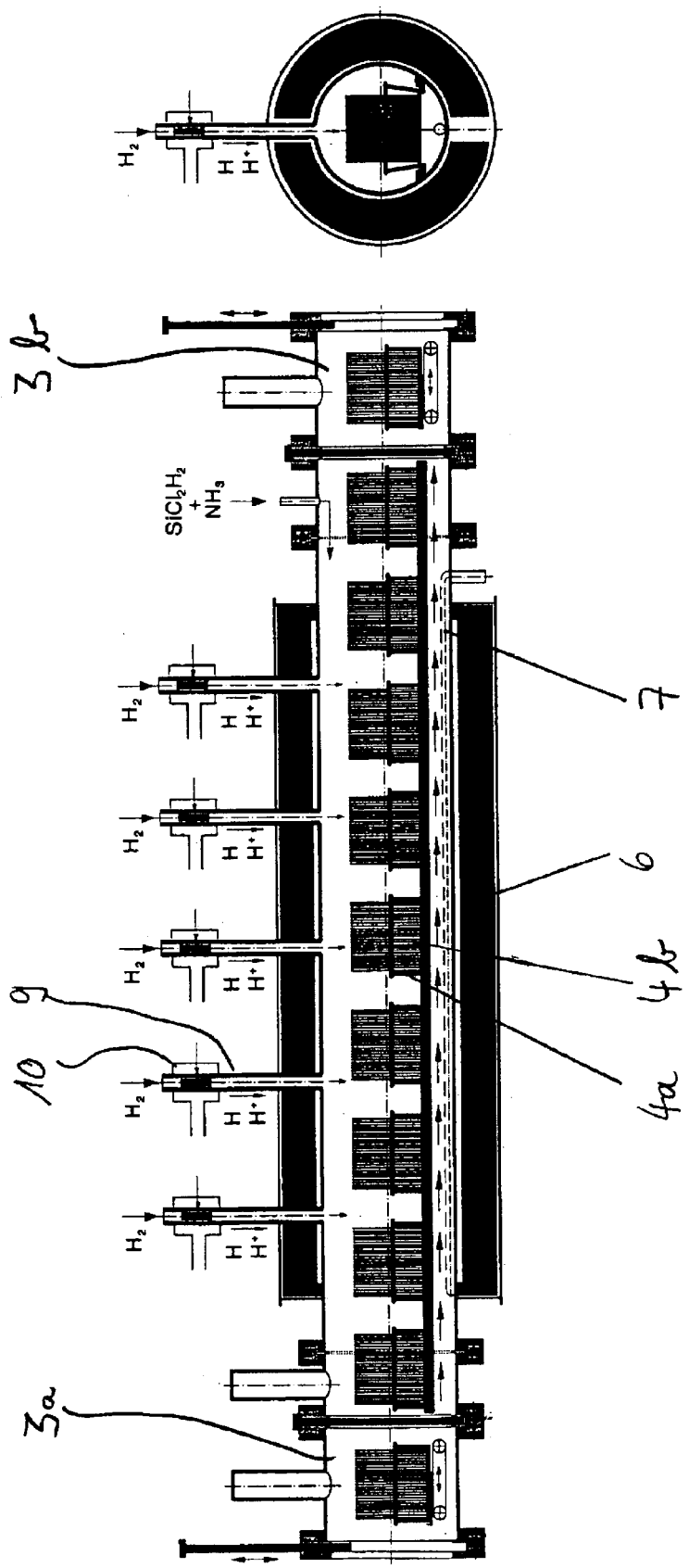

METHOD AND DEVICE FOR PRODUCING SOLAR CELLS

BACKGROUND OF THE INVENTION

The present invention concerns the preambles of the independent claims. It is therefore concerned with the fabrication of photovoltaic solar cells.

In the field of photovoltaic solar cells, the aim is usually to deliver a given power output at the lowest possible price. This demands both high efficiency and minimal production costs. The raw material can be a major contributor to cost. It is therefore desirable, whenever possible, to use multicrystalline silicon rather than high-purity single-crystal Czochralski silicon. A disadvantage of the use of multicrystalline silicon, however, is that it contains many efficiency-lowering defects. These include not only geometric defects in the structure of the crystal lattice, such as dislocations and crystal boundaries, but also incorporated foreign atoms that settle preferentially at the crystal boundaries.

To reduce the negative impact of such foreign atoms, etc., it has been proposed to neutralize the detrimental effects of at least the electronically charged defects by introducing atomic hydrogen. It is important that this atomic hydrogen not be allowed to remain at the surface of the solar cell being fabricated, but rather that it penetrate into the volume interior in order to reach the immediate vicinity of the defects to be passivated.

A number of techniques for achieving hydrogen passivation are known from the prior art. For example, it has been proposed to implant high-energy hydrogen ions in the surface region of a silicon wafer and then drive them into the volume interior by thermal means. It has further been proposed to expose the silicon wafer to a hydrogen atmosphere at temperatures that are selected to be sufficiently high, 700° C., for example, so that the molecular hydrogen dissociates and can then diffuse into the wafer. It has also been proposed to expose the samples to a hydrogen plasma that is generated capacitively or inductively directly on the silicon wafer, with no intermediary. It has further been proposed to carry out the passivation in combination with antireflex coating of the solar cells. In this case, a hydrogen-containing silicon nitride film can be deposited by PE CVD; the hydrogen atoms present in the superficial, hydrogen-containing silicon nitride film then pass into the volume of the solar cell during a subsequent processing step.

Also to be cited is the paper "Detailed study on Microwave Induced Remote Hydrogen Plasma Passivation of Multicrystalline Silicon," by M. Spiegel, P. Fath, K. Peter, G. Willeke and E. Bucher, in the 13th EC-PVSEC, Nizza, 1995, pp. 421 et seq. There, it is proposed to generate a hydrogen plasma by microwave irradiation remotely from the location of the solar cells to be processed and then to guide the plasma to the solar cells. As a rule, however, the known techniques are slow, require high technical expenditure for their industrial implementation, and/or are incompatible with typical present-day production methods. The ability afforded by the prior art to fabricate a high-efficiency solar cell at low cost is therefore limited.

SUMMARY OF THE INVENTION

The object of the present invention is to provide an innovation for industrial application, and particularly, but not exclusively, both to improve the opportunities for cost-effective manufacture of high-efficiency solar cells and to extend the methodologies gained in this area to other fields of semiconductor fabrication.

The means of accomplishing this object is claimed independently. Preferred embodiments can be found in the dependent claims.

The invention therefore proposes a process for treating semiconductors, wherein material is deposited on a semiconductor and passivation is performed by means of hydrogen plasma, the material being deposited by low-pressure CVD and the hydrogen passivation being effected by feeding in a hydrogen plasma induced remotely from the partially processed semiconductor.

In view of the differences between the process conditions of PE CVD and those of low-pressure CVD, despite the known passivation of solar cells made by the PE CVD process, it was surprising to one skilled in the art that passivation by means of hydrogen induced by microwave remotely from the location of the partially processed solar cells should bring about a significant improvement in efficiency in the low-pressure process as well, yet without substantially increasing the cost of the process.

Preferred choices for use as the semiconductor are silicon semiconductors or semiconductors containing substantial proportions of silicon. The process according to the invention is especially preferable for the fabrication of solar cells from reasonably-priced silicon substrates. Good improvements are achieved in solar cells made from multicrystalline silicon substrates, in particular; but significant improvements are also possible, for example, in the case of poorer-quality and hence more defect-ridden single-crystal silicon substrates and in the case of thin-film solar cells.

The partially processed solar cells can be heated for at least part of the time during the hydrogen passivation; this can be accomplished by means of thermal radiation from an IR light source and/or a resistance heater. Such active heating during the hydrogen passivation is preferable over keeping the temperature unchanged from a previous step, because in this way the ideal process parameters can be set.

In a preferred embodiment, the low-pressure CVD with which the hydrogen passivation according to the invention is combined is carried out to precipitate silicon nitride. This precipitation reaction typically occurs at about 750° C. Here, the actual hydrogen passivation according to the invention, effected by means of remotely induced hydrogen plasma, which typically proceeds for, e.g., 30 min at 350° C., can be shortened by having the passivation take place both during precipitation and during the heating and/or cooling phase. The reaction time for the passivation step per se can be shortened still further if the LP CVD (low-pressure CVD) is followed by a screen-printing and firing process and/or another contact firing process, since this also enables the hydrogen to diffuse deeper into the cell. The passivation is therefore performed at least in part during the change in temperature necessary for performing one or more other process steps, and furthermore, at least some of the hydrogen passivation is simultaneously performed during at least one other treatment step.

This basically makes it possible to perform volume passivation by means of a remotely induced hydrogen plasma without increasing the solar-cell processing time. The additional cost of the solar cell process according to the invention therefore depends solely on the equipment costs and additional operating costs occasioned by the hydrogen gas or hydrogen-gas mixture and the energy consumption necessary for plasma induction.

The hydrogen plasma is preferably generated by microwave irradiation, since this permits especially good control and/or regulation of the radiation intensity. The plasma generation can be carried out in a manner known per se in the presence of a nonreactive gas, especially a noble gas, especially helium. In particular, this reduces self-reactions in the plasma from the site of plasma induction to the location of the partially processed solar cells, thereby increasing the efficiency of the plasma treatment.

It is additionally preferred if, for at least a portion of the passivation phase, the hydrogen plasma is brought into contact with the partially processed solar cells in the presence of other gases. In this case, the plasma chemically activates the gases such as $NH_3$, $SiH_4$, $SiH_2Cl_2$ used to trigger precipitation, which increases the proportion of atomic hydrogen at the sample location and simultaneously accelerates the process of precipitation of, for example, SiN.

The solar cells can, of course, be advanced through a system continuously in small units, for example lying horizontally or standing vertically in groups, and processed in this way; however, it is preferable if a batch-type process is performed on a plurality of simultaneously processed wafers, since the process conditions can be controlled especially well with this approach.

The subject matter of the invention further includes a device for fabricating solar cells from a multicrystalline silicon substrate and comprising a reaction chamber for processing the solar cells, and a source of passivating hydrogen, said source of passivating hydrogen comprising a microwave generator for the microwave induction of plasma and being disposed remotely from the reaction chamber, and the reaction chamber being designed for the performance of low-pressure CVD. It can be provided, in particular, that the system is elongated for treating a large number of wafers simultaneously and the hydrogen is injected transversely to the longitudinal axis, there being provided a plurality of hydrogen-plasma injection openings, to which a plurality of hydrogen-plasma-inducing microwave arrangements is preferably assigned. The performance of the process according to the invention in such a system can be substantially automated by suitable process control.

BRIEF DESCRIPTION OF THE DRAWINGS

The invention is described hereinbelow merely by way of example with reference to the drawing. Therein:

FIG. 4a is a fourth exemplary embodiment of a solar cell production system according to the invention in sectional side elevation for quasi-continuous processing;

FIG. 4b is the fourth exemplary embodiment in transverse section.

DETAILED DESCRIPTION

Figure 1:
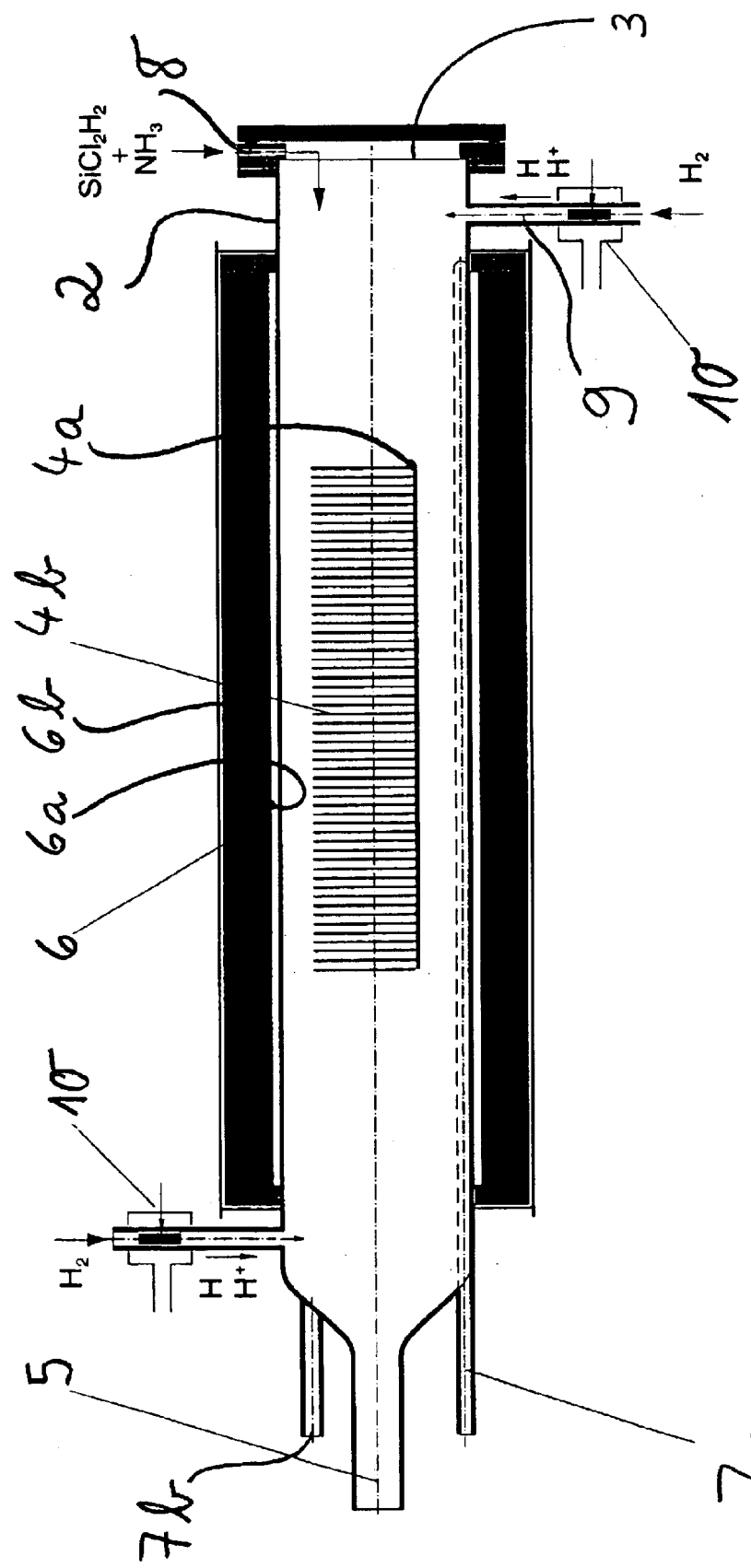
FIG. 1 is a first exemplary embodiment of a solar cell production system according to the invention in sectional side elevation.

According to FIG. 1, a system 1, denoted overall by 1, for batchwise production of solar cells comprises an elongated process tube 2 made of quartz glass. Provided at one end of the elongated process tube 2 is a sealable opening 3 large enough to allow the passage of a silicon wafer carrier bearing a large number of standing wafers 4b of multicrystalline silicon. Provided at the opposite end of process tube 2 is an exhaust opening 5 leading to a vacuum pump (not shown). Arranged along the circumference of process tube 2 is a resistance heater 6, comprising a coil 6a of resistance wire and insulation 6b against the outside environment. The resistance heater 6 is designed so that a temperature of at least 770° C. can be attained inside the process tube under all process conditions. The temperature inside the process tube 2 can be controlled by means of thermocouples 7.

Provided at opening 3 is a gas inlet 8 for process gases intended to trigger the low-pressure precipitation of material (LP CVD) onto the multicrystalline silicon wafers. To this end, gas inlet 8 is connected to suitable sources of process gases such as $SiCl_2H_2$ and $NH_3$.

Disposed diametrically opposite gas inlet 8 and perpendicular to the axis of process tube 2 is an additional inlet opening 9, which leads to a microwave cavity 10 and through which a mixture of hydrogen and helium from a suitable source is conveyed into process tube 2. Microwave energy of sufficient frequency and intensity to ignite a plasma is fed into microwave cavity 10.

An additional hydrogen plasma injection unit identical to the first is provided near exhaust opening 5. This injection unit injects the hydrogen plasma also generally perpendicularly to the longitudinal axis of process tube 2.

A control means (not shown) is provided to cause the resistance heater to follow a predetermined temperature characteristic, to control the exhausting and infeed of process gas in accordance with a predetermined desired course for the process, and to influence the delivery and excitation of the passivating gas.

The system 1 of the present invention can be used, for example, to fabricate solar cells as follows: First, the system is ventilated and loaded with conventionally prepared wafers of multicrystalline silicon. The system is then pumped down to a pressure of less than 30 mtorr for 10 min at 500° C. to remove residual gases. After that, a gas mixture composed of 90% He and 10% $H_2$ is passed in from the loading end through the microwave resonator 10 until a pressure of 500 mtorr is reached. 200 W of microwave energy at 2.4 GHz is then fed into the cavity. Passivation takes place for 40 min at 500° C., after which the temperature is raised to 750° C. at a rate of 10°/min by means of the resistance heater 6, while additional plasma is generated. Once 750° C. has been reached, the heating is continued, at a lower rate of temperature increase of 2° C./min, to 770° C. At this temperature the plasma is switched off and the tube evacuated briefly. $NH_3$ gas is then introduced from the loading end for 1 min until a pressure of 230 mtorr is reached. A mixture of 37.5 sccm dichlorosilane and 150 sccm $NH_3$ is then fed in from the loading end for 22 to 26 min, depending on whether the process tube is partially or fully loaded, and a pressure of 250 mtorr is injected. The system is then flushed out with $NH_3$ gas from the loading end for 1 min, the pressure being adjusted to 230 mtorr during this operation. A gas mixture composed of 90% He and 10% $H_2$ is again fed into the process tube and the plasma is ignited by injecting 200 W of microwave energy at 2.4 GHz into the cavity. The hydrogen passivation is continued during a cooling phase that lowers the temperature from 770° C. to 500° C. at a rate of 7° C./min. The plasma is then switched off, and the tube, after being evacuated briefly, is ventilated for unloading.

Figure 2:
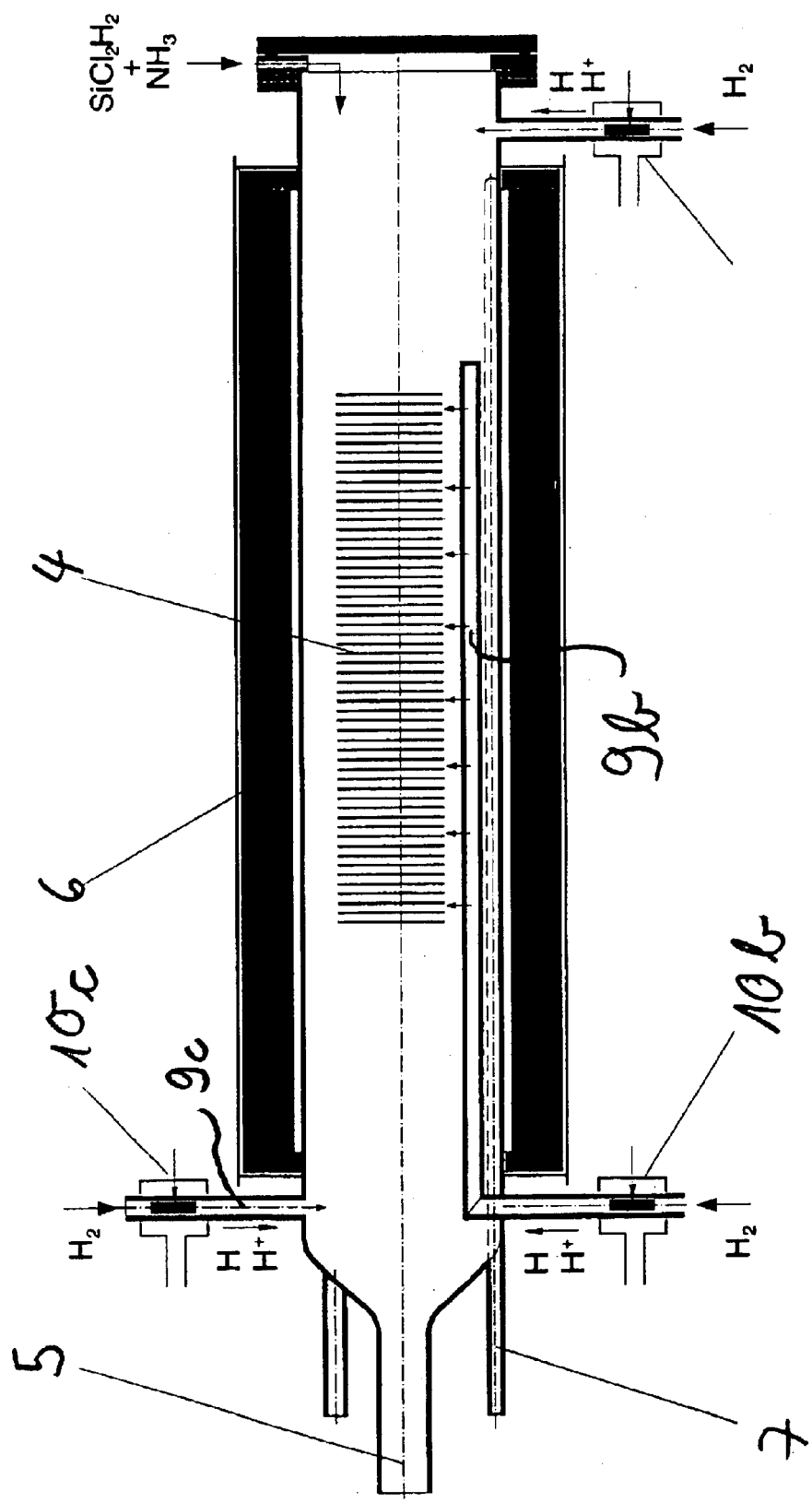
FIG. 2 is a further exemplary embodiment of a solar cell production system according to the invention in sectional side elevation.
Figures 3A, 3B:
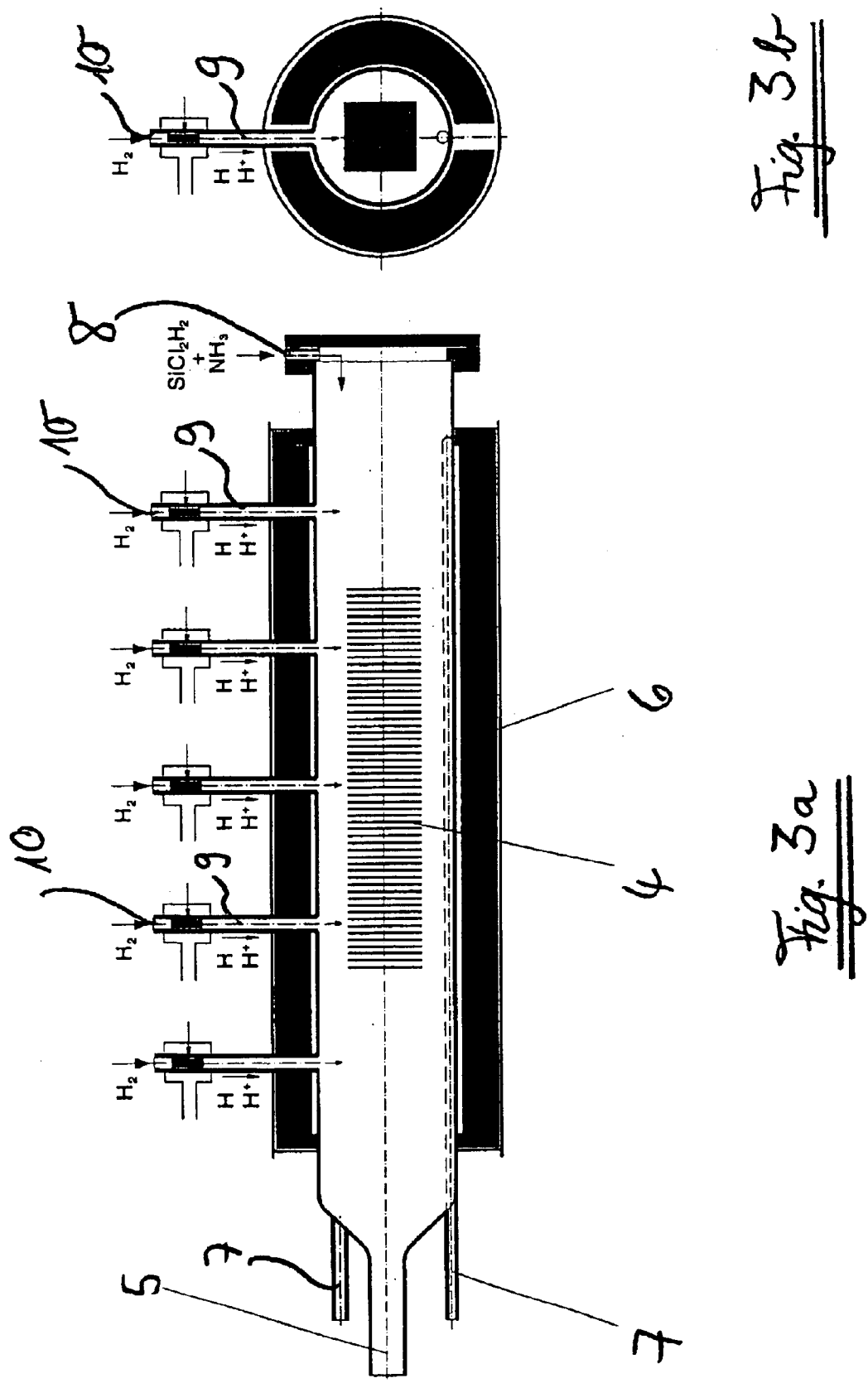
FIG. 3a is a third exemplary embodiment of a solar cell production system according to the invention in sectional side elevation.
FIG. 3b is the third exemplary embodiment in transverse section.

The arrangements of FIGS. 2 and 3 are basically identical to the example of FIG. 1, but differ with regard to the number of hydrogen injection units and their arrangement.

FIG. 2 shows an arrangement in which the hydrogen plasma is initially conveyed in a pipeline 9b inside the process tube, which increases the uniformity of the plasma precipitation. In addition, the plural microwave cavities 10a, 10b, 10c and their associated feed lines 9a, 9b, 9c make it possible to achieve especially high plasma outputs. Throughput can be increased with the arrangement of FIG. 3 as well, in which there is a row of microwave cavities 10. Obviously, the entire system can also be given a modular construction, so that production lines processing very high quantities can achieve a correspondingly high throughput.

FIGS. 4 show an exemplary embodiment of a system that can be used to carry out a quasi-continuous process of batchwise treatment of wafers according to the present invention. The actual reaction chamber, which again can be heated via a heater 6, is tube-shaped and is connected to a suitable vacuum source. The semiconductor wafers for processing are fed in through a vacuum lock 3a, so that the feed-in of a boat containing a number of wafers for processing has no detrimental effects on the pressure conditions or the gases present in the reaction chamber. Furthermore, the opposite, exit end is also provided with a vacuum removal lock 3b able to accommodate one boat at a time, plus the wafers it contains. With a suitable configuration for the vacuum lock and the pump that is to be connected to it, boats can be fed in quasi-continuously, for example at a rate of one per minute.

The boats loaded with the wafers for processing are advanced through the reaction chamber under motor drive, by means of a so-called walking beam. Disposing plural microwave cavities 10 at different positions in the system makes it possible to achieve high total throughput, with a uniform distribution of atomic hydrogen over the entire length of the system.

The solar cells obtained in this way were compared with solar cells obtained in the same system without hydrogen passivation. In addition, in the comparison process only one flushing with $N_2$ was performed during the temperature-change phases. Particularly the deposition phases performed for the comparison process were selected to be exactly as long as those performed in the case of hydrogen passivation, and the temperatures used were identical.

Photoelectric current decay curves were determined in the samples according to the invention and the comparison samples. It was found that the process according to the invention, which combines a low-pressure deposition process (LP CVD) with passivation by means of hydrogen plasma generated remotely from the location where the solar cells are processed, leads to substantial increases in minority charge carrier lifetime. For instance, the average lifetime increased from 1.74 $\mu$s to 6.94 $\mu$s with the process according to the invention. At the same time, the efficiency rose by an average of 4% (relatively).

It should be noted that there are advantages to the transposition of the direction of gas flow that occurs in the changeover from the hydrogen plasma process to the LP CVD process. For example, in the system of FIG. 2, hydrogen can also be induced through the inlet openings 9b, 9c disposed remotely from the inlet and pumped out through line 9a (which in this case need not be equipped with a microwave generator). On the other hand, the silicon- and/or nitrogen-containing process gases could still be admitted to the process tube at gas inlet 8 and evacuated through opening 5. This arrangement has the advantage that the microwave generators 10 can then be placed solely at the more readily accessible location.

It should be noted that both the system design and the wafer holder are simple and that the passivation can be done before and after cell metallization, making for especially high flexibility. It should further be noted that the process parameters can be readily be adapted to efficient bulk passivation, for example to accommodate sheet silicon, crystalline thin films and/or block-cast silicon. It is especially advantageous that sheet silicon can be used regardless of any undulations that may be present, which can cause problems when, for example, the silicon has to be laid flat against an electrode during the PE CVD process. In addition, a surface-passivating film can be applied to both sides with the LP CVD process.

Moreover, since no film is deposited on electrodes, as it is during the PE CVD process, the maintenance interval for the LP CVD process is long, and the demands placed on the vacuum system by the process as a whole are relatively low, since the lowest required pressures are about 250 mtorr. In addition, the process as a whole is not very sensitive to temperature inhomogeneities and the gas distribution.

It should be noted that although arranging the thermocouples inside the process tube 2 does furnish advantages, especially in terms of reaction time, they can also optionally be disposed outside the process tube 2, for example on its outer wall.

What is claimed is:

1. A process for treating semiconductors, wherein material is deposited on a semiconductor and passivation is performed by means of hydrogen plasma, characterized in that said material is deposited by low-pressure CVD, hydrogen passivation occurs prior to deposition of the material and the hydrogen passivation is effected by feeding in a hydrogen plasma induced remotely from the partially processed semiconductors.

2. The process as recited in claim 1, characterized in that the semiconductor treated is a silicon semiconductor or a semiconductor containing a substantial proportion of silicon.

3. The process as recited in claim 1, characterized in that the semiconductor treated is a silicon substrate, especially a silicon wafer.

4. The process as recited in claim 1, characterized in that the semiconductor treated is a multicrystalline silicon substrate, especially a multicrystalline silicon wafer.

5. The process as recited in claim 1, characterized in that it is used in the fabrication of a solar cell.

6. The process as recited in claim 1, characterized in that said partially processed semiconductor is heated for at least part of the time during said hydrogen passivation.

7. The process as recited in claim 1, characterized in that the low-pressure CVD is performed in order to precipitate silicon nitride.

8. The process as recited in claim 7, characterized in that heating is performed by means of thermal radiation from an IR light source and/or a resistance heater.

9. The process as recited in claim 1, characterized in that during said hydrogen passivation said partially processed semiconductor reaches a temperature of between 250 and 850° C.

10. The process as recited in claim 1, characterized in that said passivation is carried out at least in part during the change in temperature necessary for the performance of another process step.

11. The process as recited in claim 1, characterized in that during at least a part of said hydrogen passivation at least one other treatment step is performed simultaneously.

12. The process as recited in claim 11, characterized in that the other step is a deposition process and/or a screen-printing and firing process step.

13. The process as recited in claim 1, characterized in that said hydrogen plasma is generated by microwave irradiation.

14. The process as recited in claim 1, characterized in that said hydrogen plasma is conducted through in the presence of one of a nonreactive gas, a noble gas, and helium.

15. The process as recited in claim 1, characterized in that said hydrogen plasma is brought into contact with the partially processed semiconductor in the presence of other gases.

16. The process as recited in claim 15, characterized in that at least one of $NH_3$, $SiH_4$, $NO_2$ and/or $SiH_2Cl_2$ is selected as the other gas.

17. The process as recited in claim 15, characterized in that said other gases are excited remotely from the semiconductor to be processed by means of one or more of microwaves, laser light and UV light to plasma formation.

18. The process as recited in claim 15, characterized in that the passivating hydrogen of the induced hydrogen plasma is generated by excitation with one or more of microwave energy, laser light and UV light.

19. The process as recited in claim 1, characterized in that the entire volume of the semiconductor is passivated on both or all sides.

20. The process as recited in claim 1, characterized in that a plurality of the semiconductors in the form of solar cells are processed in batches.

21. A device for fabricating semiconductor products, especially solar cells made from a multicrystalline silicon substrate, comprising a reaction chamber for processing the semiconductor products, especially solar cells, and a source of passivating hydrogen, characterized in that said source of passivating hydrogen comprises a plasma generator which is arranged remotely from said reaction chamber, and said reaction chamber is designed for the performance of low-pressure CVD.

22. The device as recited in claim 21, characterized in that the chamber is elongated and the hydrogen is injected transversely to the longitudinal axis.

23. The device as recited in claim 22, characterized in that a plurality of hydrogen-plasma injection openings is provided transversely to the longitudinal axis and a plurality of hydrogen-plasma-inducing microwave arrangements is provided.

24. The device as recited in claim 21, comprising a motor-driven loading system for supplying said reaction chamber with partially processed semiconductor wafers.

25. The device as recited in claim 21, wherein said reaction chamber has at least two openings through which semiconductor products can be carried in and taken away.

26. The device as recited in claim 21 wherein said plasma generator is a microwave generator for microwave induction of the plasma.

* * * * *